(12) United States Patent
Hill

(10) Patent No.: US 11,464,205 B2
(45) Date of Patent: Oct. 11, 2022

(54) PET MONITORING DEVICE

(71) Applicant: SureFlap Ltd., Cambridge (GB)

(72) Inventor: Nicholas Patrick Roland Hill, Cambridge (GB)

(73) Assignee: SureFlap Ltd., Cambridge (GB)

( * ) Notice: Subject to any disclaimer, the term of this patent is extended or adjusted under 35 U.S.C. 154(b) by 26 days.

(21) Appl. No.: 16/608,697

(22) PCT Filed: Apr. 23, 2018

(86) PCT No.: PCT/GB2018/051059
§ 371 (c)(1),
(2) Date: Oct. 25, 2019

(87) PCT Pub. No.: WO2018/197849
PCT Pub. Date: Nov. 1, 2018

(65) Prior Publication Data
US 2020/0245590 A1   Aug. 6, 2020

(30) Foreign Application Priority Data
Apr. 28, 2017 (GB) .................................... 1706794

(51) Int. Cl.
*A01K 11/00* (2006.01)
*A01K 27/00* (2006.01)
(Continued)

(52) U.S. Cl.
CPC .......... *A01K 11/008* (2013.01); *A01K 27/009* (2013.01); *G06K 7/10178* (2013.01);
(Continued)

(58) Field of Classification Search
CPC .. A01K 11/004; A01K 11/006; A01K 11/008; A01K 27/009; A01K 27/001;
(Continued)

(56) References Cited

U.S. PATENT DOCUMENTS

| 8,645,738 B2 * | 2/2014 | Voutilainen ........... G06F 1/3203 713/323 |
| 8,763,559 B2 | 7/2014 | Salzmann et al. |

(Continued)

FOREIGN PATENT DOCUMENTS

| AU | 2003/216796 A1 | 7/2003 |
| CN | 103 532 524 A | 1/2014 |

(Continued)

OTHER PUBLICATIONS

International Search Report, Application No. PCT/GB2018/051059, dated Aug. 21, 2018, in 5 pages.
(Continued)

*Primary Examiner* — Thien M Le
*Assistant Examiner* — Asifa Habib
(74) *Attorney, Agent, or Firm* — Knobbe, Martens, Olson & Bear, LLP

(57) ABSTRACT

A pet monitoring device (101) for monitoring a sub-dermal RFID microchip (103), the pet monitoring device comprising: a wearable item (1) bearing 1 to 5 turns of electrical conductor (7) wound circumferentially to form a wearable item resonator; and an RFID reader (9) attachable and detachable to said wearable item, wherein said RFID reader comprises: a driving circuit (1100) comprising a primary inductance (Lp) inductively coupled to said wearable item when said RFID reader is attached to said wearable item; a secondary inductance (Ls) and resonance capacitor (Cs) conductively coupled to said wearable item when said RFID reader is attached to said wearable item, wherein the secondary inductance and resonance capacitor form the wearable item resonator with said electrical conductor, wherein the wearable item resonator comprises a circuit (1004) to automatically adjust said resonance capacitor to compensate for a size of said wearable item when fitted to said pet;
(Continued)

wherein the driving circuit is operable to drive the wearable item resonator.

15 Claims, 13 Drawing Sheets

(51) Int. Cl.
    *G06K 7/10*     (2006.01)
    *H03J 7/04*     (2006.01)
(52) U.S. Cl.
    CPC .......... *A01K 27/001* (2013.01); *A01K 27/002* (2013.01); *A01K 27/005* (2013.01); *H03J 7/04* (2013.01)
(58) Field of Classification Search
    CPC ............... A01K 27/002; A01K 27/005; G06K 7/10178; H03J 7/04
    See application file for complete search history.

(56) References Cited

U.S. PATENT DOCUMENTS

| | | | |
|---|---|---|---|
| 9,717,216 | B1 | 8/2017 | Schlachta et al. |
| 2007/0226964 | A1* | 10/2007 | Woods ............... A44B 11/2573 24/302 |
| 2008/0094225 | A1 | 4/2008 | Frankewick et al. |
| 2009/0009388 | A1* | 1/2009 | Wangrud ............. A01K 11/008 342/357.55 |
| 2010/0030167 | A1* | 2/2010 | Thirstrup ................ A61F 13/42 604/318 |
| 2014/0336524 | A1* | 11/2014 | Stewart ................ A61B 5/0024 600/549 |
| 2015/0372503 | A1 | 12/2015 | Tonchich |
| 2016/0120154 | A1* | 5/2016 | Hill ...................... A01K 11/008 340/573.3 |
| 2016/0324470 | A1* | 11/2016 | Townsend ............... G06F 1/163 |
| 2017/0111128 | A1* | 4/2017 | Hammerschmidt ........................ A01K 11/006 |
| 2017/0127975 | A1* | 5/2017 | Bozkurt ............... A01K 11/006 |
| 2020/0042036 | A1* | 2/2020 | Connor .................. A61B 5/681 |

FOREIGN PATENT DOCUMENTS

| | | |
|---|---|---|
| GB | 1 201 385 A | 8/1970 |
| WO | WO 2016/073754 A1 | 5/2016 |

OTHER PUBLICATIONS

UK Intellectual Property Office Search Report, Application No. GB1706794.3, Date of Search Oct. 10, 2017, in 1 page.

\* cited by examiner

PET MONITORING DEVICE

TECHNICAL FIELD

This invention relates to the field of pet monitoring devices. In particular, pet monitoring devices that are have the ability to read a sub-dermal RFID microchip through an antenna integrated into a collar or harness.

BACKGROUND

In recent years pet monitoring devices have become more popular. A common feature of these devices is activity monitoring through an accelerometer included in a device mounted to a pet collar or harness, or integrated into such a collar or harness. Activity tracking may be used to ensure the pet is undergoing the appropriate amount of exercise for its particular size, breed, weight, age, sex, etc. Changes in activity may be used to indicate possible changes in health of the pet.

Other forms of pet monitoring that have been implemented either on their own or in combination with activity monitoring include:
Pet temperature
External temperature
Hearth rate
Respiration rate
Blood pressure Wearable devices that monitor such physiological parameters may have drawbacks of poor accuracy, poor battery life, or can be uncomfortable for the pet. For example a collar that senses pulse rate through vibration may need to be uncomfortably tight on the pet's neck. An alternative approach is to measure the pet through use of an implanted device. A common form factor for implanted devices in pets is the RFID microchip implant, which is injected under the skin of the pet, often in the region between the shoulder blades. An example of a microchip that also includes a physiological sensor is the BioThermo microchip manufactured by Al!flex.

Background art can be found in WO2016/073754.

SUMMARY OF INVENTION

The inventors have identified that use of the area circumscribed by a collar to create an RFID antenna allows the creation of a device that has the appearance of a conventional pet collar and is both comfortable for the pet and acceptable to the pet owner. However, the inventors have identified that such use places a number of requirements on the product, as follows:

Flexibility—collars are generally flexible for comfort for the pet. Their precise geometry will change with how the pet is holding itself (sitting, lying down, etc) or through other means such as the pet scratching or a lead being attached to the collar distorting it. Any change in geometry will change coil inductance and therefore will change the tuning of any resonator setup to perform the RFID read.

Variable area—pets come in a large number of shapes and sizes and even a single pet will change in size during its lifetime through e.g. age or weight. A collar solution will need to be adjustable as purchasing a collar of the precisely required size is impractical and may change with time. Such adjustability will change the inductance and resistance of the collar antenna and change the tuning of any resonator setup to perform the RFID read.

Removable and replaceable collar—the collar will need to be applied to and removed from the pet. As such the owner will want the ability to open it up to put round the pet's neck. In addition, collars will need to be cleaned and potentially replaced more often than any reader electronics. Such detachability would allow both fitting of the collar to the pet and also replacement of the collar antenna for the electronics.

Quick release—for safety purposes some collars include a quick release function where they break apart if enough force is used. This avoids the potential for strangulation if the collar is caught on eg a branch. Quick release may be required for this sensor logging collar, and it would therefore need to be able to come apart as described above.

Robustness and strength, multi-turn antenna—RFID readers commonly have multiple turns to generate the required magnetic field for a given antenna current. A multi-turn antenna and the requirement for a detachable collar means that any connectors used will have to be multi-pole. This will make them more expensive and more prone to damage e.g. when the collar is pulled by attaching a lead.

Lightweight—a single turn antenna would normally be driven via a transformer so that it converts the antenna into a similar electrical load as a multi-turn antenna. A conventional RFID reader circuit can then be used with such a transformed antenna. However, to create a high quality transformer working at typical microchip frequencies around 125 kHz-134 kHz, this would generally require a large and heavy transformer device that would not be comfortable for the pet to wear around their neck.

According to one aspect of the present disclosure there is provided a pet monitoring device for monitoring a sub-dermal RFID microchip, the pet monitoring device comprising: a wearable item bearing 1 to 5 turns of electrical conductor wound circumferentially to form a wearable item resonator; and an RFID reader attachable and detachable to said wearable item, wherein said RFID reader comprises: a driving circuit comprising a primary inductance inductively coupled to said wearable item when said RFID reader is attached to said wearable item; a secondary inductance and resonance capacitor conductively coupled to said wearable item when said RFID reader is attached to said wearable item, wherein the secondary inductance and resonance capacitor form the wearable item resonator with said electrical conductor, wherein the wearable item resonator comprises a circuit to automatically adjust said resonance capacitor to compensate for a size of said wearable item when fitted to said pet; wherein the driving circuit is operable to drive the wearable item resonator.

The driving circuit may comprise a resonance capacitor, the primary inductance and resonance capacitor of the driving capacitor forming a reader resonator.

In embodiments, an inductance of said wearable item resonator is less than the primary inductance of said reader resonator and where a quality factor (Q) of said wearable item resonator is higher than a quality factor (Q) of said reader resonator.

The quality factor (Q) of said wearable item resonator may be greater than, or equal to 20.

In embodiments, the inductance of said wearable item resonator is based on an inductance of the electrical conductor and the secondary inductance.

In embodiments, the reader resonator is inductively coupled to the wearable item resonator, wherein a coupling constant of said inductive coupling is below 30%

The coupling constant of said inductive coupling may be below 20%.

The circuit to automatically adjust said resonance capacitor of the wearable item resonator may comprise a plurality of capacitors each coupled to a respective switch to enable each of the plurality of capacitors to be switched in or out of parallel connection with said resonance capacitor of the wearable item resonator.

The pet monitoring device may further comprise a controller having an input to sensing an amplitude and phase of a waveform of the driving circuit, and a further input to sense an amplitude and phase of a waveform of the wearable item resonator, the controller configured to control said circuit to automatically adjust said resonance capacitor based on said waveforms.

The controller may be configured to control the circuit to automatically adjust said resonance capacitor of the wearable item resonator so that the wearable item resonator resonates at a frequency of the sub-dermal RFID microchip The pet monitoring device may further comprise RFID reading circuitry configured to detect a resonance envelope in the wearable item resonator or the reader resonator and provide an RFID reading of the RFID microchip.

The RFID reading of the RFID microchip may comprise a unique ID number associated with the RFID microchip.

The primary inductance may be formed from a predetermined number of turns wound around a magnetic core and the secondary inductance may be formed from a predetermined number of turns wound around said magnetic core.

In embodiments, in use said turns of electrical conductor carry a current of at least 5 amps.

Each of said RFID microchip and said RFID reader may include a respective temperature sensor.

In these embodiments, the RFID reader may be configured to process data from both said temperature sensors to determine a temperature of a pet wearing said wearable item. The data from said temperature sensor of the RFID reader may trigger a measurement of the pet's internal temperature using the temperature sensor of the RFID microchip The wearable item may include an adjustment ring such that the wearable item is adjustable in fit without substantially changing a length of said electrical conductor.

The wearable item may comprise one or a pair of quick release buckles each at a respective end or set of ends of said conductor, each with a respective set of electrical contacts for physically and electronically connecting said wearable item to said RFID reader.

The wearable item may bear a single turn of said electrical conductor.

The wearable item may be a collar or harness.

According to another aspect of the present disclosure there is provided a wearable item for a pet, the wearable item comprising: 1 to 5 turns of electrical conductor wound circumferentially a pair of connectors each at a respective end of said electrical conductor, the electrical conductor terminating at an electrical contact at each connector of said pair of connectors, said pair of connectors for physically and electronically connecting said wearable item to an external enclosure an adjustment ring such that the wearable item is adjustable in fit without substantially changing a length of said electrical conductor.

The electrical contact at each connector may comprise multiple spring contacts in parallel.

The electrical contact at each connector may comprise two spring contacts on a first side of the connector and a further two spring contacts on a second side of the connector opposing said first side.

Each connector of said pair of connectors may be a male portion of a quick release buckle.

In embodiments, the wearable item threads through the adjustment ring, threads through a slot in a connector of said pair of connectors, folds back to pass through the adjustment ring again, and folds back and terminates at said connector.

The wearable item may further comprise a leash connection ring.

The wearable item may be a collar or harness.

According to another aspect of the present disclosure there is provided a pet monitoring system comprising: a sub-dermal RFID microchip implanted in a pet; and a pet monitoring device for monitoring the sub-dermal RFID microchip, the pet monitoring device comprising: a wearable item bearing 1 to 5 turns of electrical conductor wound circumferentially to form a wearable item resonator; and an RFID reader attachable and detachable to said wearable item, wherein said RFID reader comprises: a driving circuit comprising a primary inductance inductively coupled to said wearable item when said RFID reader is attached to said wearable item; a secondary inductance and resonance capacitor conductively coupled to said wearable item when said RFID reader is attached to said wearable item, wherein the secondary inductance and resonance capacitor form the wearable item resonator with said electrical conductor, wherein the wearable item resonator comprises a circuit to automatically adjust said resonance capacitor to compensate for a size of said wearable item when fitted to said pet; wherein the driving circuit is operable to drive the wearable item resonator.

The RFID reader may be configured to transmit a unique identifier to a remote device in the pet monitoring system, wherein the unique identifier comprises a unique ID number associated with the RFID microchip that is read by the RFID reader, and/or a unique ID number associated with the pet monitoring device.

The sub-dermal RFID microchip may comprise at least one sensor, the at least one sensor comprising one or any combination of: a temperature sensor, an activity sensor, a heart rate sensor, a pulse sensor, a respiration sensor, and a glucose level sensor; and the RFID reader is configured to transmit sensor data received from the at least one sensor of the RFID microchip in raw or processed form, to the remote device.

The pet monitoring device may be configured to process data from at least said temperature sensor to determine a temperature of the pet wearing said wearable item.

The RFID reader may comprise at least one sensor, the at least one sensor comprising one or any combination of: an activity sensor, an external temperature sensor and a location sensor; and the RFID reader is configured to transmit sensor data received from the at least one sensor of the RFID reader, in raw or processed form, to the remote device.

The unique identifier may comprise the unique ID number associated with the RFID microchip, and the RFID reader may be configured to link the sensor data with the unique ID number associated with the RFID microchip prior to transmission of the sensor data to the remote device.

The unique identifier may comprise the unique ID number associated with the RFID microchip, and the remote device may be configured to link the sensor data with the unique ID number associated with the RFID microchip.

The sensor data may comprise location data sensed by the location sensor for tracking a location of the pet.

The pet monitoring system may further comprise a server in a network, wherein the remote device is coupled to said network and is configured to upload the sensor data and the unique identifier to the server.

The unique identifier may comprise the unique ID number associated with the RFID microchip, the server may be configured to link the sensor data with the unique ID number associated with the RFID microchip.

The server may be configured to generate an alert or information based on the sensor data and transmit said alert or information to one or more of: the pet monitoring device, said remote device, and a further remote device in the pet monitoring system The pet monitoring system may further comprise a server in a network the server coupled to a data store storing a plurality of microchip ID numbers of lost pets, each of the plurality of microchip ID numbers stored in association with an identifier of an owner of the respective lost pet, wherein the remote device is coupled to said network, wherein the remote device is configured to transmit a message comprising a location of the pet and the unique ID number associated with the RFID microchip to the server, the server configured to: compare the unique ID number associated with the RFID microchip to the plurality of microchip ID numbers stored in the data store; determine that the pet is lost based on said comparison; and transmit an alert to the owner of the pet indicating said location using the identifier associated with the unique ID number.

The remote device may be configured to determine said location using a location sensor on the remote device.

The RFID reader may comprise a location sensor, and the remote device may be configured to determine said location based on location data received from the RFID reader.

The remote device may be configured to link a location within a premises with the unique ID number associated with the RFID microchip to determine the location of the pet within said premises.

The remote device may be a mobile computing device in said premises, said location within the premises sensed by a location sensor on the remote device.

The location within the premises may be a fixed location where the remote device is located in said premises.

The premises may be a house, veterinary practice or animal shelter.

The remote device may be a mobile computing device or a network gateway device.

Whilst in above embodiments the antenna is included in a collar. The antenna may equally be included in a pet harness. In the harness the antenna may be around the neck of the pet, or further back around the tummy of the pet, behind the front legs of the pet. Alternatively, the antenna may be mounted on the top of the dog. The antenna may be detachable from the harness and may be attached to it in a number of different positions, for example by Velcro.

BRIEF DESCRIPTION OF THE DRAWINGS

For a better understanding of the present subject matter and to show how the same may be carried into effect, reference will now be made by way of example to the accompanying drawings in which.

DETAILED DESCRIPTION

Embodiments will now be described by way of example only.

Figure 1:
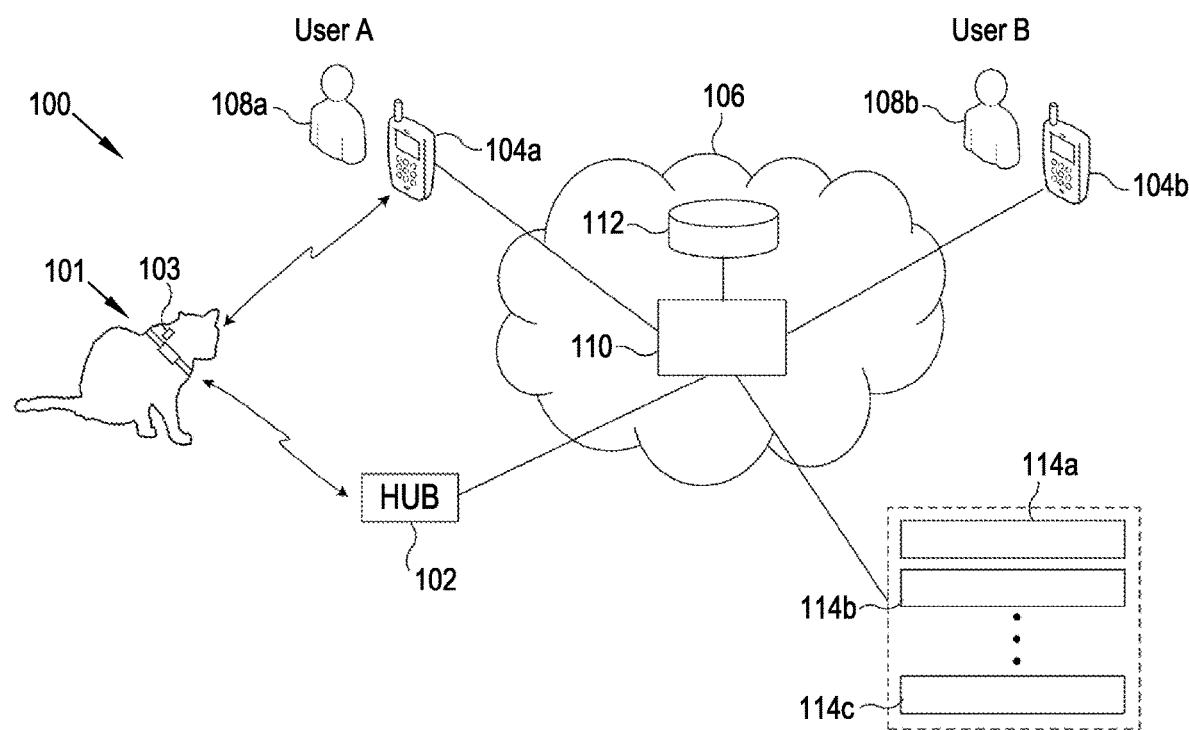
FIG. 1 is a schematic illustration of a pet monitoring system.

FIG. 1 shows a pet monitoring system 100 comprising a pet wearing a pet monitoring device 101, the pet having a sub-dermal RFID microchip 103. Whilst FIG. 1 shows a cat wearing the pet monitoring device 101 embodiments of the present disclosure extend to the pet monitoring device 101 being suitable to be worn by any other animals such as a dog or horse (note that these are just examples) into which the RFID microchip 103 may be implanted.

The sub-dermal RFID microchip 103 may comprise one or more sensors. For example the sub-dermal RFID microchip 103 may comprise a temperature sensor, an activity sensor, a heart rate sensor, a pulse sensor, a respiration sensor, a glucose level sensor, and/or a sensor for performing any other chemical level detection. The sub-dermal RFID microchip may also return an ID number. The sensor output may be incorporated into spare fields in the identification telegram.

The pet monitoring device 101 may transmit data via a wireless connection e.g. over radio (Bluetooth, WiFi or other protocol) or via infrared, to a mobile computing device 104a associated with a user 108a (e.g. User A shown in FIG. 1). The mobile computing device 104a may be, for example, a mobile phone, a personal digital assistant, a tablet computer, or a laptop computer. Alternatively or additionally, the pet monitoring device 101 may transmit data via a wireless connection e.g. over radio (Bluetooth, WiFi or other protocol) or via infrared, to a hub device 102 which operates as an internet connected radio gateway (a network gateway device).

The pet monitoring device 101 may transmit raw data or data that has had some processing (i.e. processed data).

As shown in FIG. 1, the mobile computing device 104a and the hub device 102 are coupled to a network 106 comprising a remote server 110 which is coupled to a data store 112. The mobile computing device 104a and/or the hub device 102 may upload the data to the remote server 110 for storage in the data store 112, for sharing or analysis.

Note that the mobile computing device 104a may be connected to the network 106 via an additional intermediate network not shown in FIG. 1. For example, if the mobile computing device 104a is a mobile phone, then it can connect to the network 106 via a cellular mobile network (not shown in FIG. 1), for example a GSM or UMTS network. One or more further mobile computing devices 104b may also be connected to the network 106 (e.g. associated with a family member 108b of user 108a).

One or more external systems 114 may also be connected to the network 106 and be able to transmit/receive data to the remote server 110. The one or more external systems 114 may comprise for example a pet feeding station, a weather monitoring system, or a smart cat flap (comprising for example a temperature sensor to sense the ambient temperature of a room in which the cat flap is provided).

The pet monitoring system 100 will be further described later but first, we describe the pet monitoring device 101 in more detail.

Figure 2:
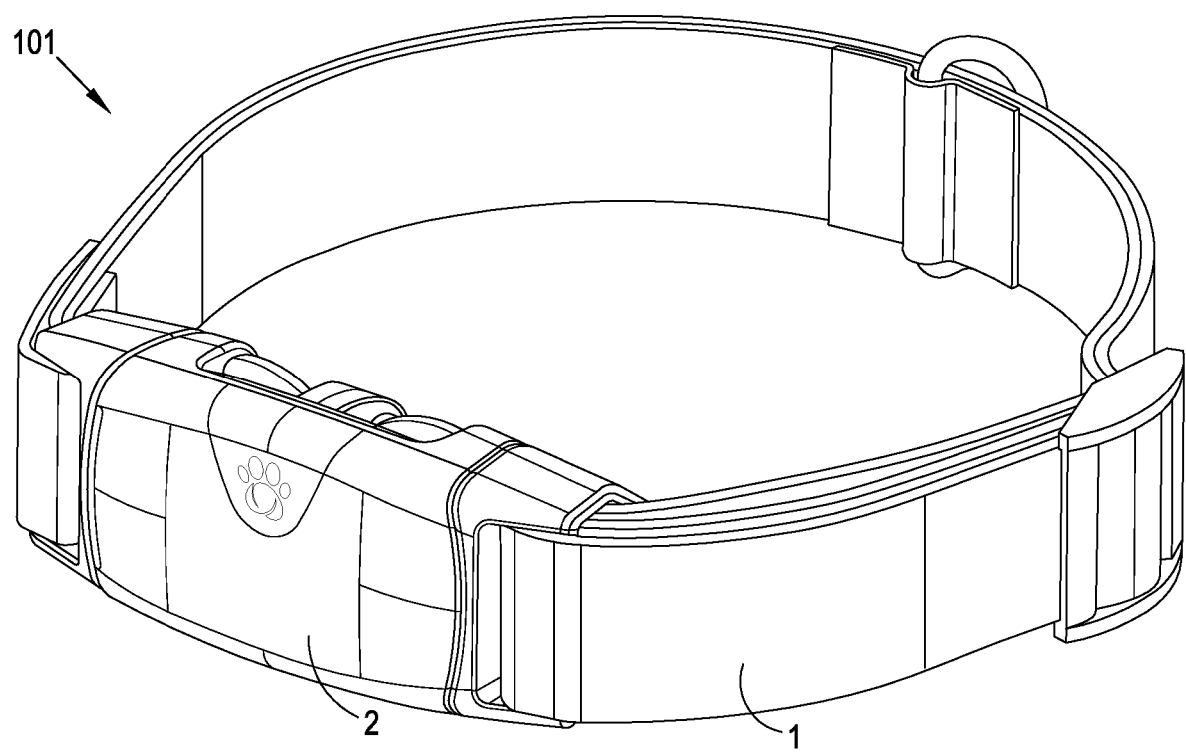
FIG. 2 shows an image of a pet monitoring device including a collar and electronics enclosure incorporating an RFID reader.

FIG. 2 shows an image of the pet monitoring device 101 comprising a collar 1 and an enclosure 2 housing electronics.

Figure 3:
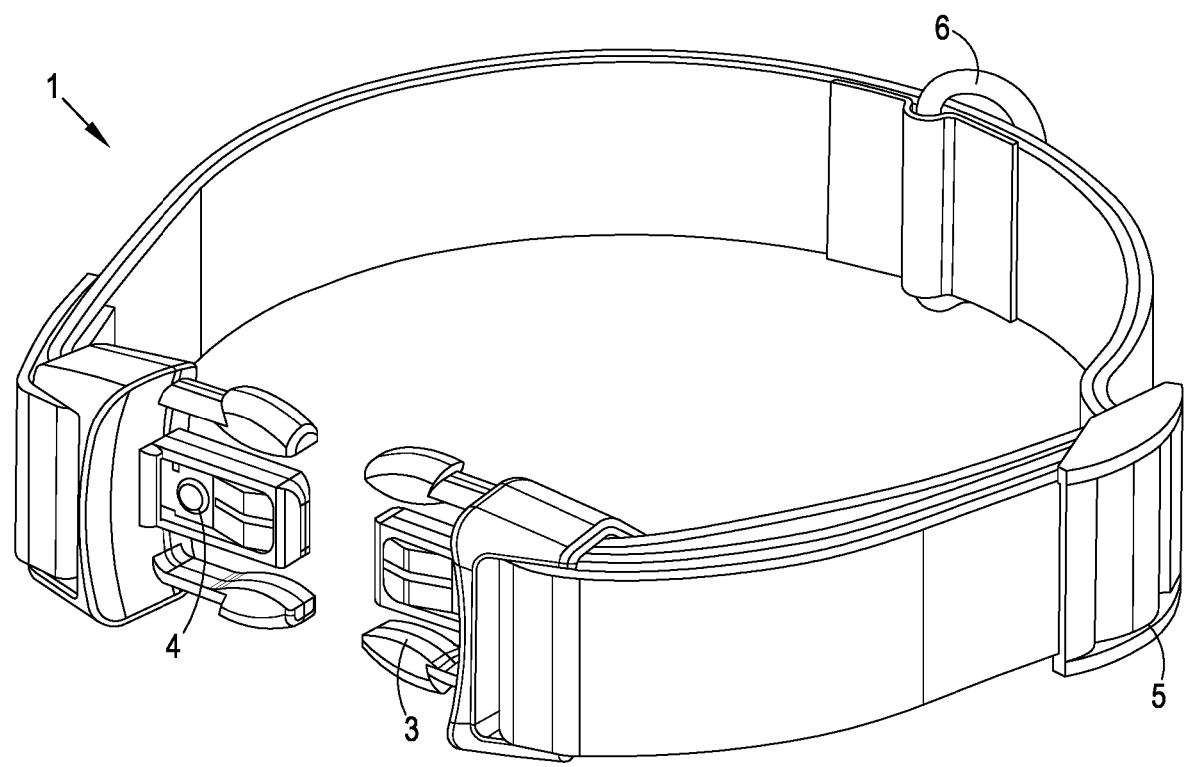
FIG. 3 shows an image of the collar where the electronics enclosure has been removed.

FIG. 3 shows the same pet monitoring device 101 with the enclosure 2 removed. That is, it will be apparent that the enclosure 2 is attachable and detachable to the collar 1. FIG. 3 shows the collar 1 together with connectors in the form of terminating clips 3 with embedded electrical connectors 4.

As shown in FIGS. 2 and 3, each end of the collar 1 may be provided with a clip (a male portion of a side release buckle) which connect into the enclosure 2 via respective openings (female portions of the side release buckle).

The collar 1 may be attached or removed from the neck of a pet by unclipping the connectors 3 to open the collar 1, putting it on the pet, and clipping the collar 1 closed again.

Figure 4:
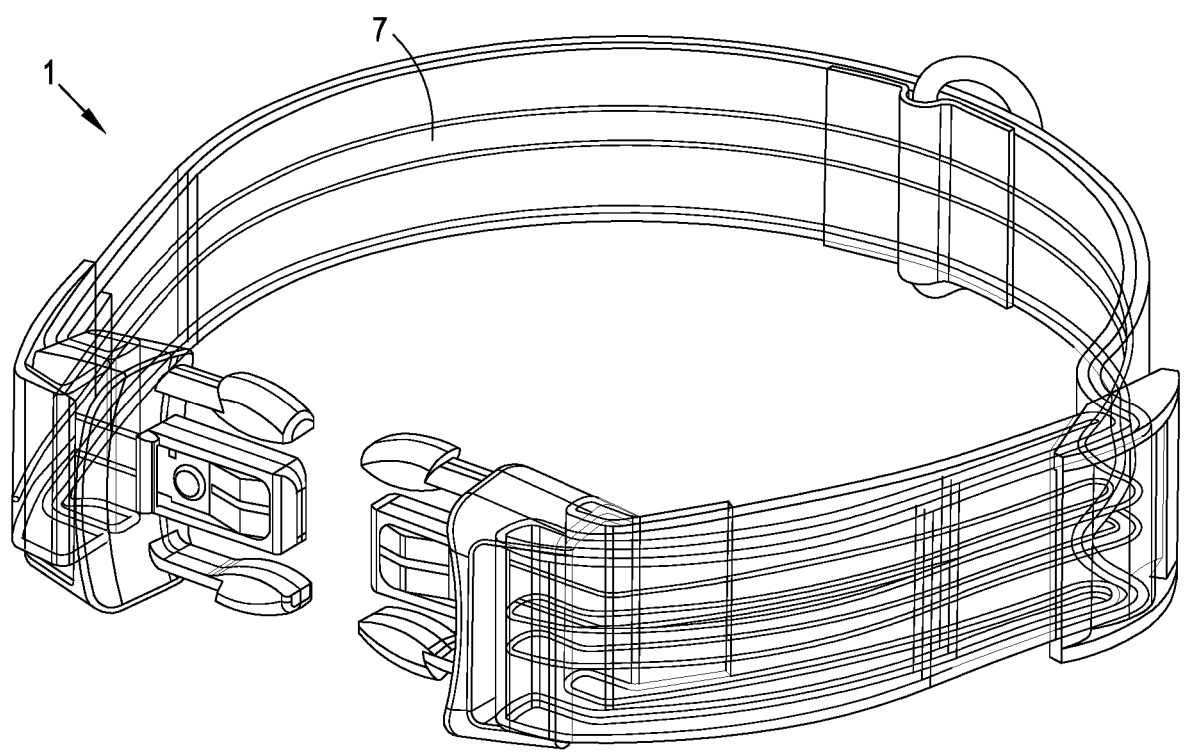
FIG. 4 shows an image of the collar where the collar has been made transparent to show an internal electrical conductor.

As shown in FIG. 4, the pet collar 1 incorporates at least one conductive element 7 that goes around the neck of the pet. The conductive element 7 is terminated at electrical contacts 4 on the connectors 3 at either end of the collar. The connectors 3 have a dual function to clip the ends of the collar 1 in place (in the enclosure 2) and to make electrical connection to the enclosure 2 such that a current can pass around the neck of the pet.

The conductive element 7 may be a copper braid 7 that forms the conductive path between the two electrical contacts 4 on each clip 3. The copper braid 7 gives low resistance and good flexibility, allowing it to easily be folded back on itself for the collar size adjustment. Also the collar itself is nicely flexible similar to a normal collar and is comfortable for the pet. The connection of the braid 7 to the electrical contacts 4 on each clip 3 may be crimped. In use, the conductive element 7 may carry a current of at least 5A, in other embodiment the conductive element 7 carries a current of at least 10A.

It will be appreciated that the conductive element is not necessarily copper braid and could be for example one or more turns of wire (e.g. litz wire) or other configurations.

The electrical contacts 4 may comprise multiple spring contacts in parallel, minimising the chance that any rattle or give in the clips 3 will result in the connection being broken. This also minimises the chance that dirt may become trapped in the connector 3 which would break the electrical connection to the enclosure 2.

In particular, the electrical contacts 4 may be formed by two spring contacts on the top side (facing outwards with respect to a pet's neck) and two spring contacts on the bottom side of each clip (facing inwards with respect to a pet's neck). Each clip 3 therefore has four sprung contact points that make contact with a flat connecting surface in the electronic enclosure when the clips 3 are fitted to it. As a result of these four connection points, there is increased tolerance of the connection to vibration, shock and dirt, making a more reliable connection.

The collar 1 may be supplied as an easy to replace accessory so the owner can customise to their tastes and/or replace it when it gets dirty or damaged. The collar 1 may be supplied in a range of different sizes. These may all connect to a single electronics enclosure 2.

Referring back to FIG. 3, the collar may comprise a leash connection ring 6 which acts as a connection for a lead.

Figure 5:
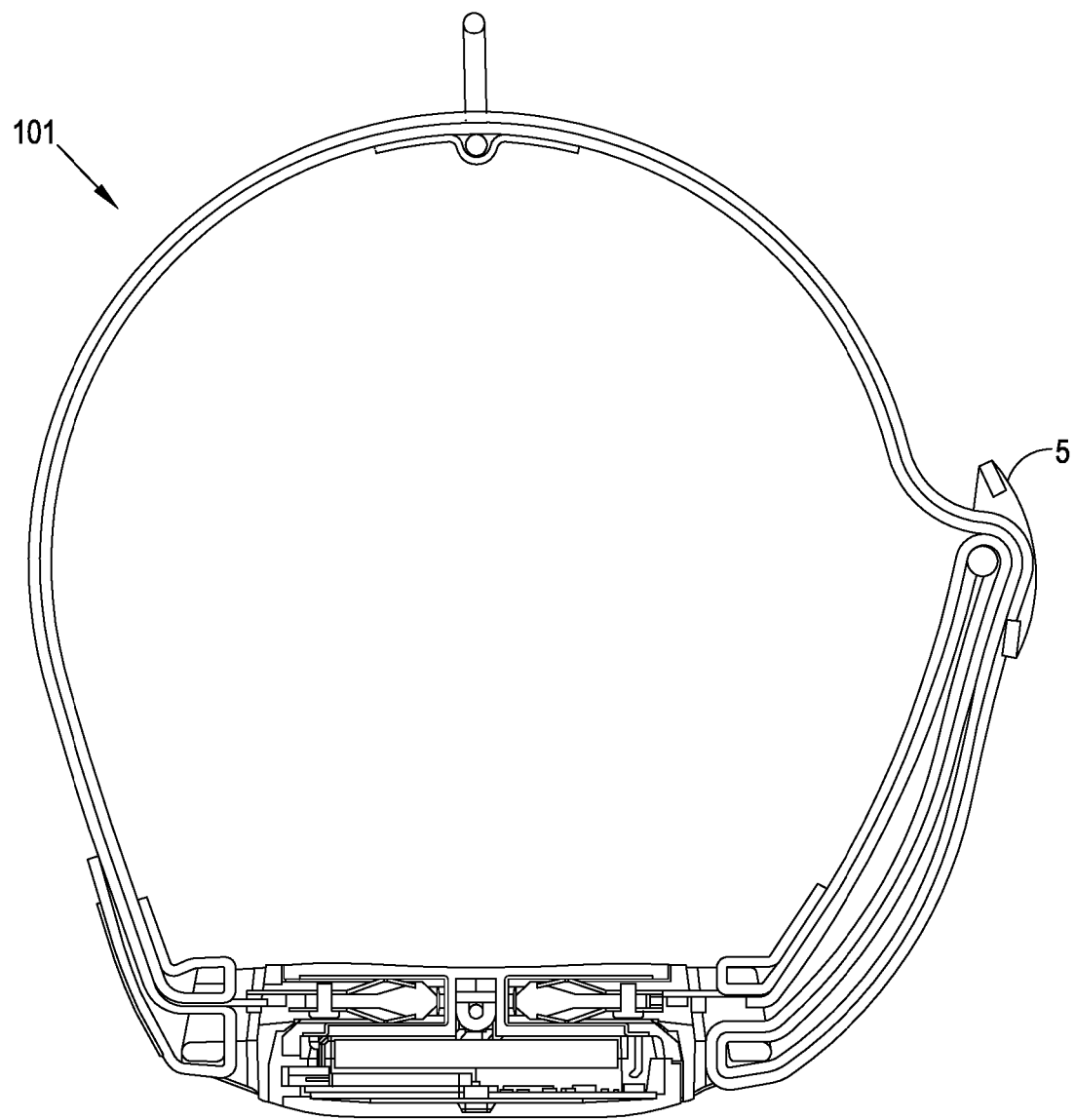
FIG. 5 shows a cross section of the pet monitoring device.

Also shown in FIG. 3 is an adjustment ring 5. The collar 1 threads through the adjustment ring 5, then goes through a slot in the terminating clip 3 and folding back to the adjustment ring 5. It then goes through the adjustment ring 5 again before folding back to the clip 3, terminating there. Adjustment of the position of the ring 5 and then taking up the slack in the collar 1 allows the total length of the collar to be adjusted. FIG. 5 shows a cross section of the pet monitoring device 101 where this path of the collar 1 through the adjustment ring 5 can be seen.

Figure 6:
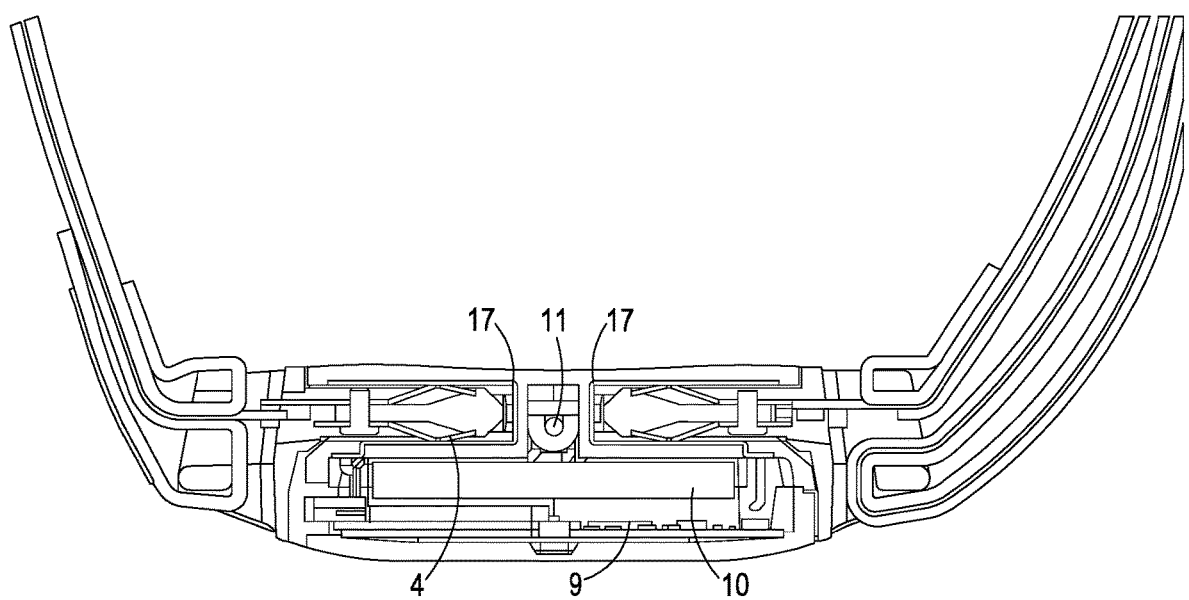
FIG. 6 shows a cross section of the electronics enclosure of the pet monitoring device where the collar and connecting clips are fitted to the enclosure.

FIG. 6 shows a zoomed in image of FIG. 5, focussed on the region of the electronics enclosure 2 with the clips 3 fitted. The spring electrical contacts 4 are in contact with electrical contacts 17 on the enclosure 2. The spring electrical contacts 4 are present on both sides of each clip 3. The electronics enclosure includes a PCB 9, battery 10, and a ferrite rod 11.

Figure 7A:
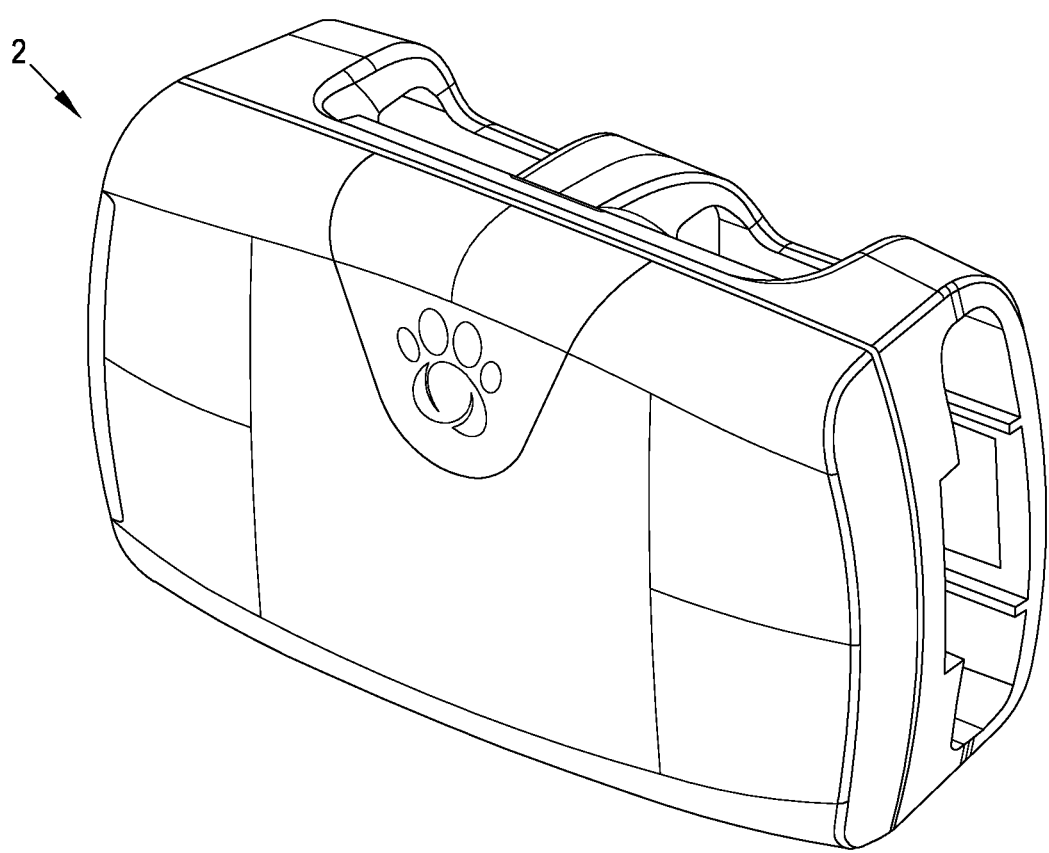
FIGS. 7a and 7b show two views of the electronics enclosure without the collar and connecting clips.
Figure 7B:
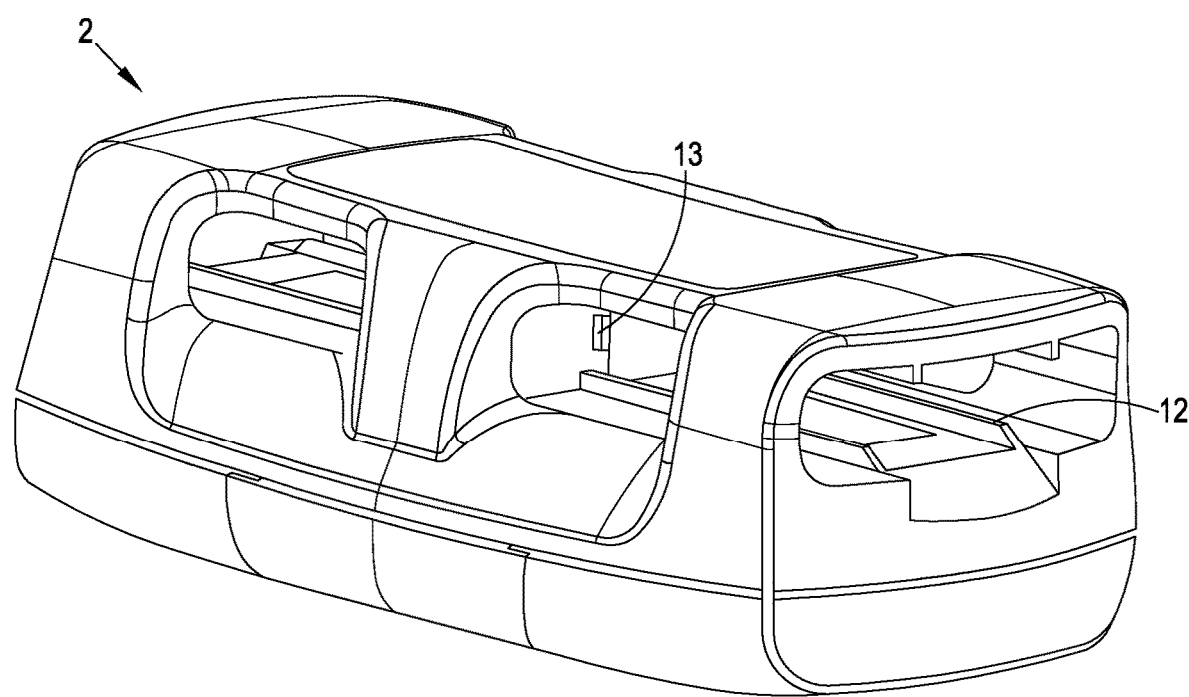

FIGS. 7a and 7b show different views of the outer casing of the electronic enclosure 2. The enclosure 2 includes openings 12 to allow the clips 3 to fit into, and finger cut outs 13 to allow easy pinching of each clip 3 to release the clips 3 from the enclosure 2.

Figure 8:
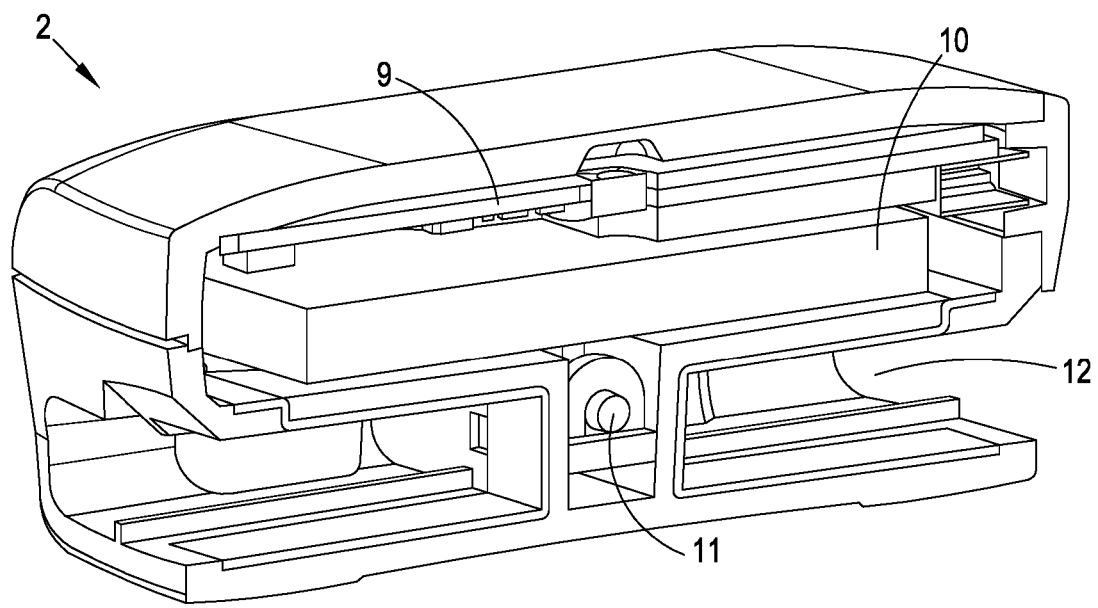
FIG. 8 shows a further view of the electronics enclosure.

FIG. 8 shows a further cross section of the enclosure where the PCB 9, battery 10, ferrite rod 11 and opening 12 to allow clip fitting are shown together.

The embodiment described above has the advantage of very easy removal of the collar 1 from the electronics enclosure 2. Advantages include:

1) Easy replacement of a damaged or worn out collar.
2) Easy changing of the collar for a different colour or pattern. A range of different collars may be produced to suit the owner's taste.
3) Easy replacement of damaged or worn out electronics.
4) Each collar is adjustable with movement of the adjustable ring over most of its length (depending on the position of the fixed leash attachment ring). This gives a high degree of adjustability of the overall collar size.

Figure 9:
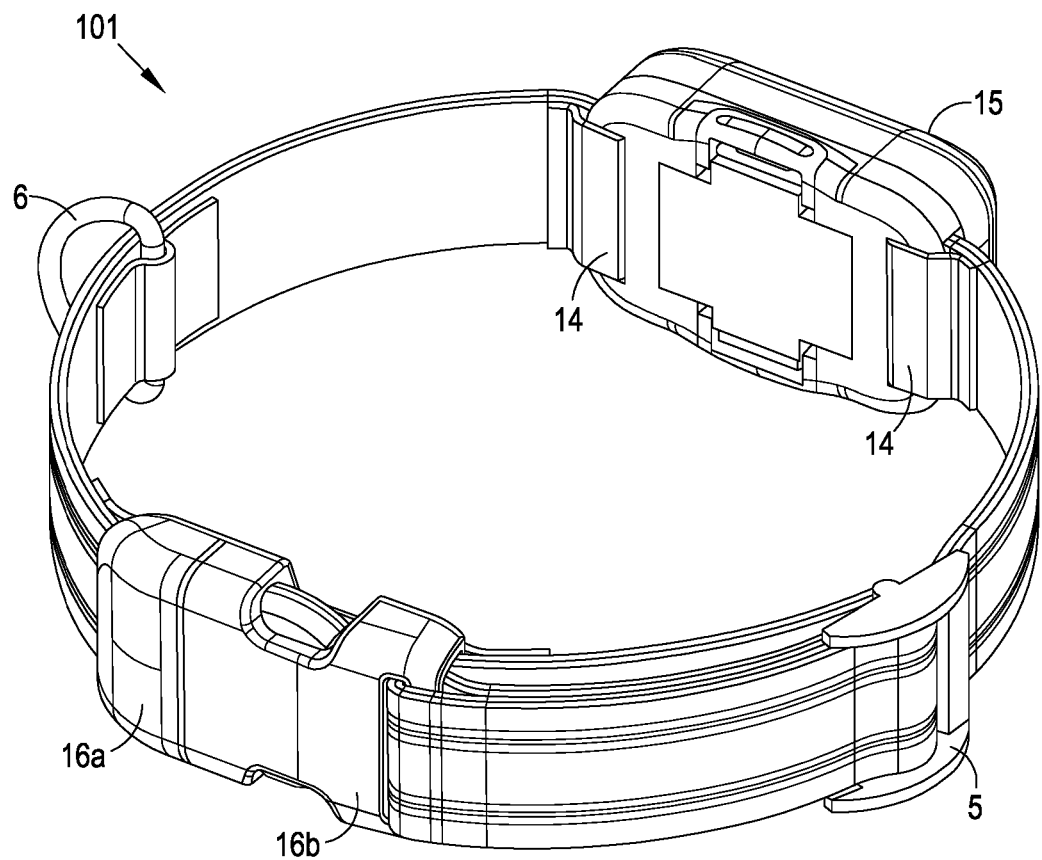
FIG. 9 shows a further embodiment of a pet monitoring device.

FIG. 9 shows an alternative embodiment of the pet monitoring device.

In this embodiment the clips connect two ends of a collar, with connection to the electronics enclosure being made through other means. The other means may include semi-permanent connections to the electronics enclosure.

In FIG. 9 the collar is split into two parts with each part having a semi-permanent connection 14 to an electronics enclosure 15. This semi-permanent connection is only changed when the collar is changed. It can therefore be relatively inconvenient to change, such as requiring a screwdriver to unscrew a connecting screw. As a result it can be a more compact connection 14 to the electronics enclosure 15. The result can be a smaller electronics enclosure than the previous embodiment. It is however less convenient to change collars than the first embodiment.

Each part of the collar is terminated in a clip 16 that is connected to the internal conducting braid. One part of the collar has a male clip 16a and the other part of the collar has a female clip 16b. The clips are shown connected together. These can be separated to allow the collar to be put onto or taken off a pet. Electrical connection and completion of the electrical circuit around the collar is made when the clips are connected together. The electrical connections are formed in a similar manner to the first embodiment. The collar also incorporates a lead connection ring 6 and collar adjustment ring 5.

This embodiment has an advantage of smaller electronics enclosure than the first embodiment. However a greater number of electrical connections is required and the collar also has a smaller level of adjustability due to the fact that the adjustment ring 5 can only be slid over one side of the collar. The first embodiment has a greater degree of adjustability.

RFID reader circuitry that is formed on the PCB 9 will now be described with reference to FIGS. 10-12.

Figure 10:
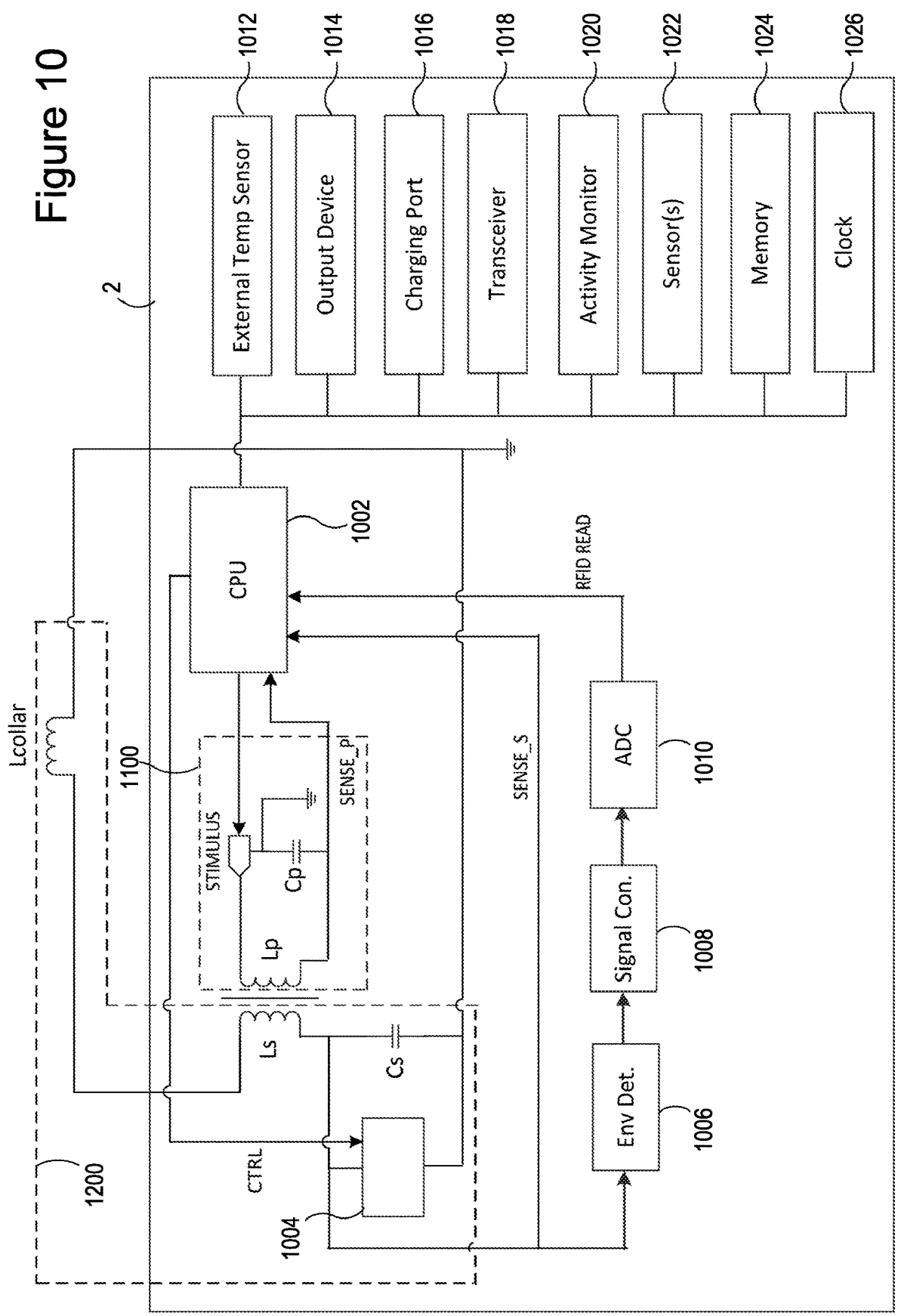
FIG. 10 illustrates RFID reader circuitry housed within the electronics enclosure.

FIG. 10 illustrates RFID reader circuitry housed within the electronics enclosure 2.

As shown in FIG. 10, when the collar 1 is attached to the enclosure 2 the enclosure 2 is conductively coupled to the collar 1. The collar 1 comprises a small number of turns of electrical conductor (e.g. 5 or less turns), in FIG. 10 the inductance of these turns is represented by the inductor Lcollar.

The RFID reader circuitry comprises a controller (e.g. a microprocessor) 1002 which is coupled to a driving circuit 1100. The controller 1002 is configured to output a stimulus voltage (e.g. a square wave) to the driving circuit 1100. The driving circuit 1100 comprises a primary inductor Lp which is formed by a predetermined number of turns Np around the ferrite rod 11. The stimulus voltage is provided to a first terminal of the primary inductor Lp.

In some embodiments, the driving circuit 1100 comprises a resonant capacitor Cp which together with the primary inductor Lp form a primary resonance circuit (also referred to herein as a reader resonator). In these embodiments, the stimulus voltage is provided to a first terminal of the resonant capacitor Cp. An example primary resonance circuit 1100 will be described in further detail with reference to FIG. 12.

In other embodiments, the driving circuit 1100 is not a resonant circuit. For example, the primary inductor Lp and capacitor Cp may not be at resonance. In another example, the capacitor Cp is not present in the driving circuit 1100 (removed and shorted out) so that primary inductor Lp is directly driven on the primary side.

The driving circuit 1100 is operable to drive a secondary resonance circuit 1200.

The secondary resonance circuit 1200 comprises a secondary inductor Ls which is formed by a predetermined number of turns Ns around the ferrite rod 11. The secondary inductor Ls is connected in series with the collar inductance, Lcollar. The total inductance of the secondary resonance circuit 1200 is based on the secondary inductor Ls and the inductance of the collar antenna itself, Lcollar. Thus the inductance of the secondary resonance circuit 1200 will vary depending on the adjusted size of the collar antenna.

The secondary resonance circuit 1200 comprises a resonance capacitor Cs connected in series with the secondary inductor Ls and the collar inductance Lcollar to form a resonator.

The resonance capacitor Cs is chosen to resonate with the antenna when it is adjusted for its smallest inductance at the frequency of the RFID microchip 103. This frequency may be 134 kHz.

The secondary resonance circuit 1200 comprises a circuit 1004 to automatically adjust the resonance capacitor to compensate for a size of the collar when fitted to the pet. Circuit 1004 comprises additional tuning capacitors that may be coupled into the resonance with switches such as mosfets. The range of the total capacitance that may be coupled into the resonance may be chosen to allow resonance with the smallest size (and therefore lowest inductance) to the largest size (and therefore greatest inductance).

The tuning capacitors may be binary weighted with respect to each other to allow fine tuning of the resonance capacitance. An example secondary resonance circuit 1200 will be described in further detail with reference to FIG. 12.

As shown in FIG. 10, the controller 1002 outputs a control signal to the circuit 1004 to control the switches of the circuit 1004.

The controller 1002 comprises an input which is connected to a second terminal of the primary inductor Lp and a second terminal of the resonant capacitor Cp for sensing an amplitude and phase of a waveform of the primary resonance circuit 1100 by receiving the signal SENSE_P on this connection.

The controller 1002 comprises a further input which is connected to the series connection between the secondary inductor Ls and the resonance capacitor Cs for sensing an amplitude and phase of a waveform of the secondary resonance circuit 1200, the controller 1002 configured to determine the best tuning setting of the circuit 1004 for resonance in the secondary resonance circuit 1200 (so that the secondary resonance circuit 1200 resonates at a frequency of the sub-dermal RFID microchip 103 in the pet)

In embodiments whereby the driving circuit 1100 is a resonance circuit, the RFID reader may be built around a weakly coupled resonator topology.

That is, the primary resonance circuit 1100 may be weakly inductively coupled to the secondary resonance circuit 1200. The coupling constant (sometimes referred to as the coefficient of coupling) may be below 30%, preferably below 20%. Persons skilled in the art will be familiar with what is meant by the term coupling constant (indicating the flux built in a primary winding that is linked and goes through to a secondary winding) and therefore is not discussed in detail herein. The coupling may be via air cored coils or via a magnetic element such as a ferrite rod or ferrite torus.

The secondary resonance circuit 1200 may have a relatively high Q, preferably 20 or greater. As the primary resonance circuit 1100 is weakly coupled, the resonance circuit 1100 does not strongly influence the Q of the secondary resonance circuit 1200, even if the primary resonance circuit 1100 has a significantly lower Q than the secondary resonance circuit 1200. Furthermore, the coupling element may be small and lightweight.

As mentioned above, the tuning of the secondary resonance circuit 1200 can be adjusted by monitoring the amplitude and phase of the primary and secondary resonance circuits to bringing the secondary to resonance. At resonance there is high current in the secondary and this presents a high resistive load to the primary. The energy dissipation in the primary is therefore dominated by this resistive load and there is an efficient delivery of energy from the drive circuit to the secondary. Note that because of this high resistive load, the effective Q of the primary is low and is not determined by only the primary coil resistance. This low effective Q means that the primary may not require a tuning circuit to remain on resonance. The only required tuning circuit is for the secondary.

The RFID circuitry in the enclosure 2 further comprises an envelope detection module 1006 which is connected to the series connection between the secondary inductor Ls and the resonance capacitor Cs, and receives as an input the signal on this connection. The envelope detection module 1006 is a diode, capacitor, resistor combination that outputs the amplitude of the resonance signal to a signal conditioning module 1008.

The amplitude of the resonance signal is then low pass filtered and amplified by the signal conditioning module 1008 to give a more sensitive measure of variation in the resonance amplitude. The RFID tag modulates the resonance amplitude so this signal conditioned output from the signal conditioning module 1008 is a sensitive measure of the tag modulation.

Whilst FIG. 10 shows the secondary resonance circuit 1200 being used to provide the RFID reading, alternatively the envelope detection can be taken from the primary resonance circuit 1100.

The signal conditioning module 1008 is coupled to an analogue to digital converter 1010 which converts the analogue signal received from the signal conditioning module 1008 and converts this to a digital signal which is provided by the analogue to digital converter 1010 to the controller 1002 as an RFID reading.

Figure 11:
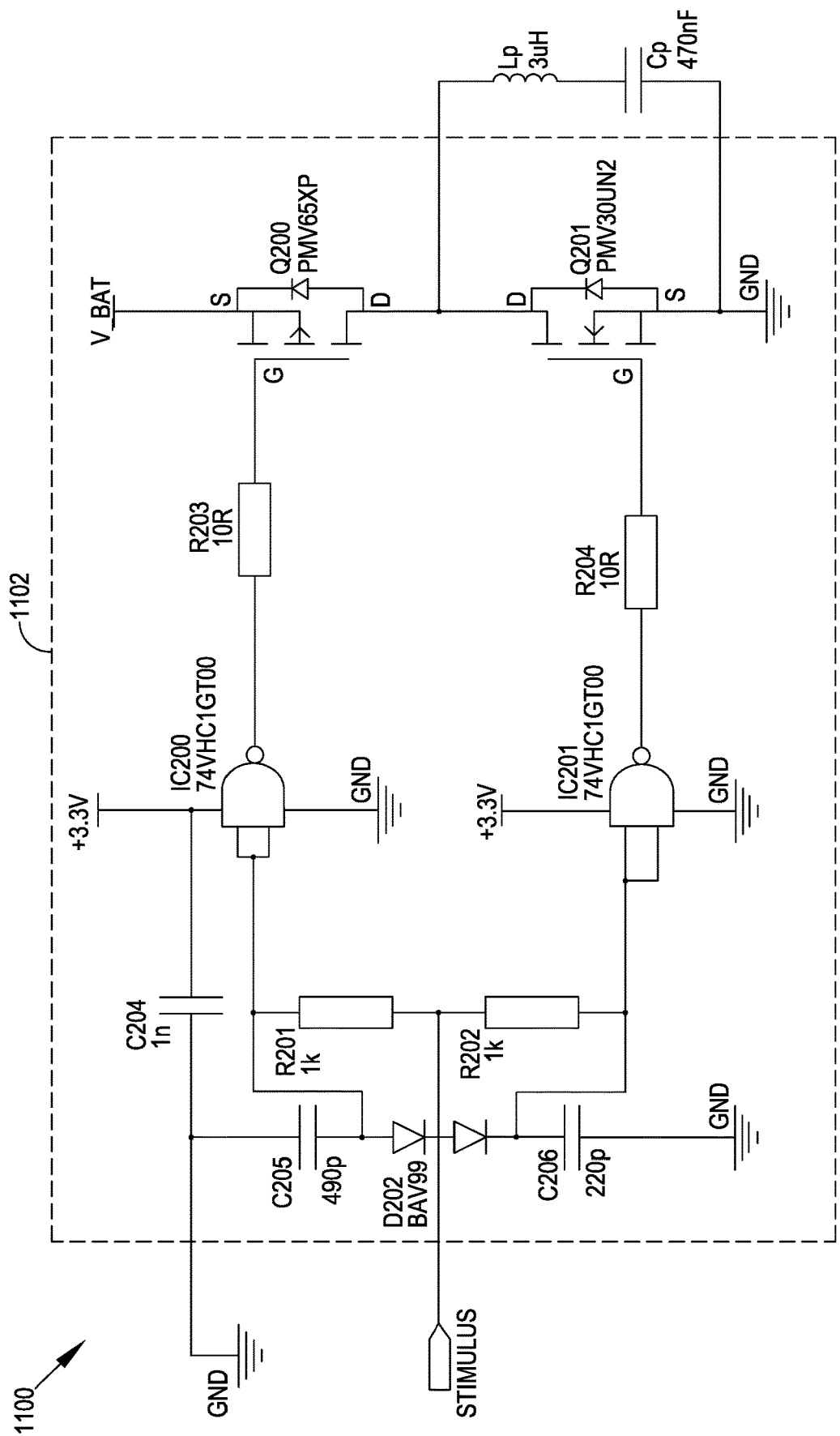
FIG. 11 shows a schematic of a primary resonance circuit.

FIG. 11 shows an example schematic of a primary resonance circuit 1100 which receives the stimulus voltage (STIMULUS) output from the controller 1002. The primary inductor is formed by a predetermined number of turns Np around the ferrite rod 11 giving an inductance 3 uH inductance. Together with the 470 nF capacitor this gives a resonance of 134 kHz.

As shown in FIG. 11, the primary resonance circuit 1100 comprises a circuit portion 1102. The circuit portion 1102 comprises output mofsfets Q200 and Q201 which are a complementary mosfets pair that applies a square wave to the resonance circuit Lp and Cp. The stimulus carries a driving square wave which is output from the controller 1002. The resistor, diode, capacitor network that the stimulus connects to introduces delay to the square wave edges to generate a deadband delay. The outputs from IC200 and IC201 coupled to this network are similar to the stimulus voltage but with deadband delay included to avoid shoot through in the mosfets pair.

It will be appreciated that the component values referred to above and shown in FIG. 11 are merely examples.

Figure 12:
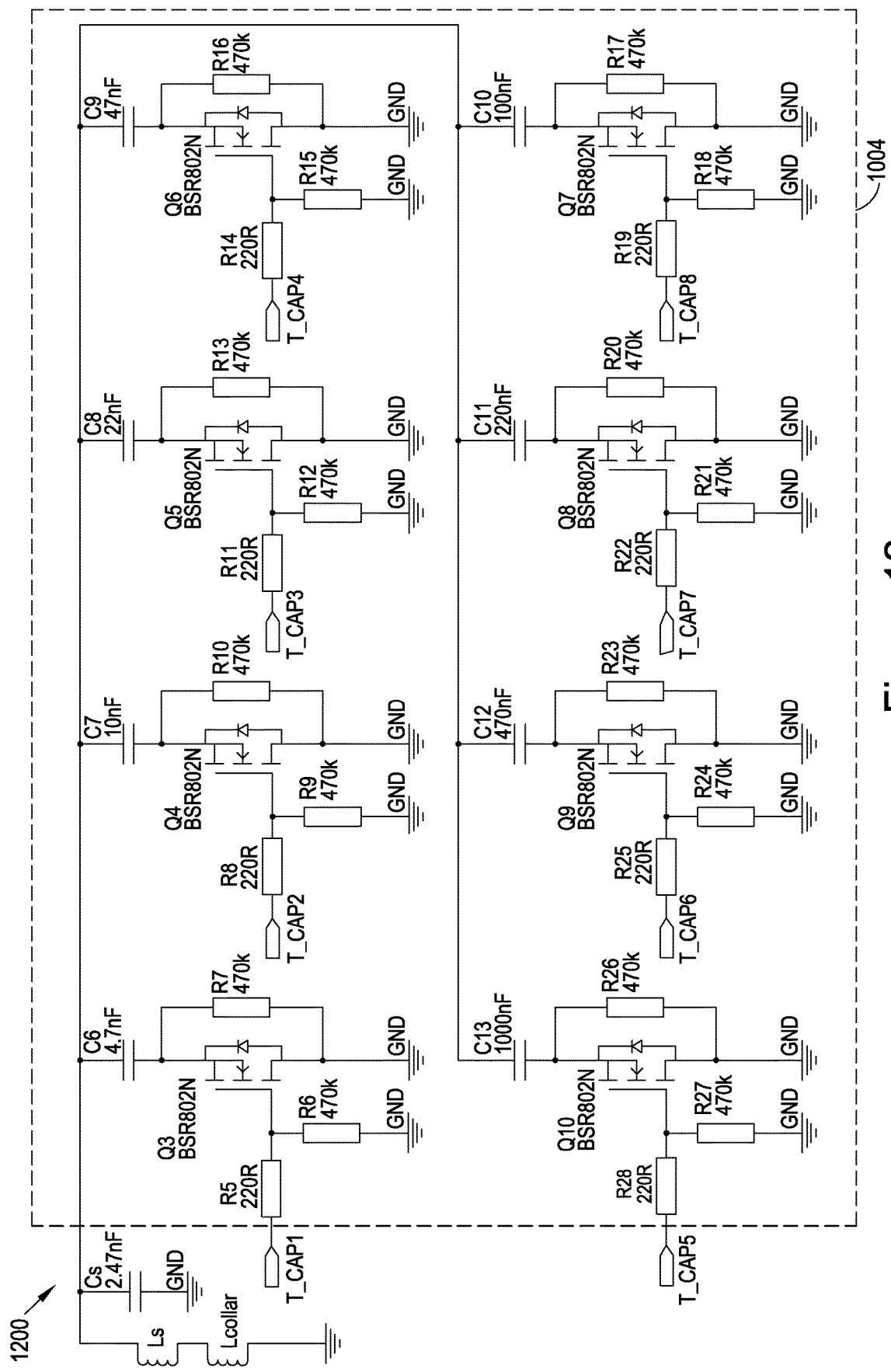
FIG. 12 shows a schematic of a secondary resonance circuit including a tuning circuit.

FIG. 12 shows an example schematic of the secondary resonance circuit 1200. The total inductance of the secondary resonance circuit 1200 (based on the secondary inductor Ls and the inductance of the collar antenna itself Lcollar) may be for example 360 nH and this inductance resonates with the secondary resonance capacitor Cs of 2.47 uF. In addition, there are a set of 8 tuning capacitors C6 to C13 in the circuit 1004 that can be coupled into the resonance via a set of 8 mosfets under the control of the controller 1002. It will be appreciated that these component values are merely examples. Whilst 8 tuning capacitors and corresponding mosfets are shown in FIG. 12, this is merely an example.

Referring back to FIG. 10, as shown the controller 1002 may be coupled to an external temperature sensor 1012 (for sensing the temperature of the ambient environment).

The pet will preferably have a temperature sensing microchip 103 under its skin and the pet monitoring device 101 will read the microchip 103 and report temperature. The temperature measurement may be periodic, may be in response to remote command e.g. from a remote base station 102, or may be in response to other sensor data such as activity monitoring.

It is known that environmental temperature can have a strong influence on the measured pet temperature. As such the pet monitoring device may have an external temperature sensor 1012. Interpretation, by either controller 1002 or remote server 110, of the pet temperature read by the RFID circuitry in the enclosure 2, may be made in combination with the external temperature data measured by the external temperature sensor 1012. In addition, external temperature measurements may be used to trigger measurements of the pets internal temperature.

As shown in FIG. 10, the controller 1002 may be coupled to an output device 1014 such as a light or buzzer. The controller 1002 may interpret temperature data itself and indicate to the owner a possible problem such as the dog overheating by outputting an audible or visual alert using the output device 1014.

The electronics enclosure 2 may include a charging port 1016 coupled to the controller. The charging port may be covered by a seal. A connector 3 may incorporate the seal or ensure the seal is in place properly when the connector 3 is correctly clipped in place into the enclosure 2.

The electronics may have circuit protection built in to ensure that if the circuit does become broken when there is current flowing in the coil that any voltage spike is controlled and there is no damage to the electronic.

The controller 1002 is coupled to a transceiver 1018 to allow communication to and from the mobile computing device 104a and/or the hub device 102. Types of suitable transceiver will be known to persons skilled in the art and therefore these are not discussed in detail here. The electronics enclosure 2 may also comprise a wired interface to allow a wired connection to a computing device.

It is known that levels of activity can have a strong influence on the temperature of a pet. As shown in FIG. 10, the controller 1002 may be coupled to an activity monitor (sensor) 1020 (e.g. a 3-axis accelerometer). Activity measurements may be used to trigger measurements of the pets internal temperature using a temperature sensor on the microchip 103.

As shown in FIG. 10, one or more other sensors 1022 may be included in the electronics enclosure 2. Whilst FIG. 10 shows the sensors 1022 as being included in the electronics enclosure 2, one or more of the sensors 1022 may be external to the enclosure and attached to the collar 1 (or harness).

The sensors 1022 may comprise a location sensor for sensing the location of the pet.

The location sensor uses geographic location technology for determining the location of the pet, in terms of a geographic position relative to the surface of the earth; for example, a satellite based technology such as GPS (Global Positioning System, including potential variants such as assisted GPS or differential GPS), GLONASS (Global Navigation Satellite System) or Galileo, and/or trilateration (or more generally muiltilateration) relative to a plurality of different wireless base stations or access points having known locations; and/or a technique based on detecting signal strength relative to a known base station or access point. Other well-known location sensing methods may be used by the location sensor.

As shown in FIG. 10, the controller 1002 is coupled to a memory 1024 and clock 1026. The controller 1002 is configured to store data in the memory 1024 which is timestamped using the clock 1026. The data stored in the memory 1024 by the controller 1002 may include internal temperature data read from the microchip 103 by the RFID circuitry, a voltage of the battery 10, external temperature data sensed by the external temperature sensor 1012, activity data sensed by the activity monitor 1020, location data sensed by a location sensor 1022 and other parameters sensed by the sensors 122.

Thus, the controller 1002 is able to store data in memory 1024 when the enclosure 2 does not have a connection to the mobile computing device 104a or hub device 102, and transmit the stored data to the mobile computing device 104a and/or hub device 102 when a connection becomes available. For example, the controller 1002 may store data locally e.g. for 1 week and upload a batch of data for storage, sharing or analysis when a connection is made.

The RFID reader circuitry housed within the electronics enclosure 2 may be arranged to read the RFID microchip 103 at regular intervals (e.g. 5 minutes between reads). This may be varied based on a desired lifetime of the battery 10, level of activity of the pet, history of temperature profile or any other parameter.

Sensor data from the external temperature sensor 1012 and/or from sensors 1022 may also be used to increase or decrease the frequency of internal temperature measurement of the pet through the temperature sensing microchip 103.

Referring back to the pet monitoring system 100 shown in FIG. 1, the pet monitoring device 101 transmits sensor data (e.g. internal temperature data, external temperature data, activity data, location data) together with a unique identifier to the mobile computing device 104a and/or hub device 102 via the transceiver 1018.

The sensor data may be in raw form or processed form having been processed by the controller 1002. For example the internal temperature data transmitted by the pet monitoring device 101 may be the internal temperature data read from the RFID microchip 103 by the RFID circuitry of the enclosure 2, or be processed internal temperature data that compensates with the external temperature sensed by the external temperature sensor 1012. Similarly, the activity data transmitted by the pet monitoring device 101 may be raw accelerometer data sensed by the activity monitor 1020 or processed activity data indicating an activity state of the pet (e.g. walking, running, etc.).

The unique identifier may be an ID number of the RFID microchip 103 and/or an ID number of the pet monitoring device 101 (e.g. a MAC address).

The mobile computing device 104a and/or the hub device 102 may upload the sensor data and the unique identifier to the remote server 110 for storage in the data store 112, for sharing (e.g. with another mobile computing device 104b) or analysis.

The remote server 110 may be configured to process the sensor data and transmit information back to the pet monitoring device 101. The data store 112 may be configured to store unique collar ID numbers (e.g. MAC addresses) in association with RFID microchip numbers, thus the remote server 112 is able to determine the unique collar ID number of the pet monitoring device 101 based on querying the data store with a received microchip number. Alternatively or additionally, the remote server 110 may transmit the information back to the mobile computing device 104a or another computing device 104b which has been registered to receive the processed information (e.g. a device of user 108b being a family member of user 108a). The processed information may take many different forms and may include for example a temperature profile over a time period, baseline temperature information, location information and activity state information.

The remote server 110 may be configured to transmit an alert to the pet monitoring device 101, mobile computing device 104a or another computing device 104b which has been registered to receive alerts (e.g. a device of user 108b being a family member of user 108a), based on processing the received sensor data. For example an alert may indicate to the owner a possible problem such as the pet overheating or having a fever (e.g. if the sensor data indicates that the pet has a high temperature but low activity this may indicate that the pet has a fever).

The pet monitoring system 100 described herein may be used with a microchip 103 with a sensor included. However, there are also beneficial uses when only an ID number is included in the microchip 103.

The pet monitoring device 101 is able to measure the pet's microchip ID number and transmit it using transceiver 1018 to a remote receiver such as the mobile computing device 104a or remote server 110. When the pet's microchip ID number is compared to RFID microchip numbers stored in the data store 112, the pet may be identified and potentially located through the radio transmission and/or other location means, such as location data received from the pet monitoring device 101 or location sensing on the mobile computing device 104a.

Applications include the following:
1) Identification of a pet through the microchip number when it enters a veterinary practice. This can be used to track the location throughout the facility and through any procedures such as an operation. The pet monitoring device 101 can be used to monitor the pet either through activity, temperature, or other data throughout its time at the veterinary facility.
2) Location of a pet within a facility such as an animal shelter. Each pet may be located within the facility which will help inventory tracking.
   In the above examples, a wireless receiver in a premises (e.g. a home, veterinary facility, animal shelter) would detect the microchip number that is transmitted by the pet monitoring device 101. The wireless receiver would link a location within the premises with the unique ID number associated with the RFID microchip (to indicate that the pet is at this particular location).
   In one example, the wireless receiver is a mobile computing device (such as mobile computing device 104) comprising a location sensor thereby being able to sense to the location within the premises using the location sensor. In another example, the wireless receiver is at a fixed location within the premises (e.g. reception, examination room, exercise area).
   The wireless receiver may transmit an indication of the location in the premises and the unique ID number associated with the RFID microchip to the server 110 for storage in the data store 112.
   It will be appreciated that multiple wireless receivers may be implemented in the pet monitoring system 100 so that the location of the pet may be tracked as the pet moves through the premises.
3) If a pet is lost the pet monitoring device 101 can broadcast its microchip number to a mobile computing device (such as mobile computing device 104). The mobile computing device can transmit a message comprising a location of the pet and the microchip number to the server 110. The data store 112 coupled to the server 110 may store a list of lost animal microchip numbers each in association with an identifier (e.g. telephone number, email address etc.) of the lost pet's owner, Upon receiving the message from the mobile computing device, the server 110 may compare the microchip number to the list of lost animal ID numbers stored in the data store 112. This comparison (in the event of a match) may then be used by the server 110 to alert the owner of the location of the pet (using the identifier). Using such an approach the pet monitoring device 101 will not be a security risk, as might be the case if it included owner details. Instead the data store 112 is secure and the pet microchip number can be broadcast freely.

The mobile computing device may determine the location of the pet using a location sensor on the mobile computing device. If the pet monitoring device 101 comprises a location sensor, the mobile computing device is able determine the location of the pet based on location data received from the pet monitoring device 101.

4) Activity monitoring of a pet is a common requirement now, but with a collar attachment there is no guarantee that the activity being measured is of the correct pet. In some applications this is critical. One such application is activity monitoring to prove a pet is healthy and well cared for. Such monitoring may be used to prove a lower risk for pet insurance, lowering insurance premiums. For such a financial gain there could be a requirement to prevent fraud where the activity monitor is attached to a different pet. Linking the activity to the microchip ID number guarantees that the activity corresponds to the correct pet.

The RFID circuitry in the enclosure 2 may comprise circuitry to monitor the continuity of the connection to the collar 1 (antenna). If the continuity is broken and there is no conductivity between the electrical contacts 4 on the collar 1 and the electrical contacts 17 on the enclosure 2 then the controller 1002 may register that the pet monitoring device 101 has potentially been removed from the pet. The controller 1002 may act on this information including the following possibilities:

The controller 1002 may broadcast an alert to mobile computing device 104a and/or remote server 110 via transceiver 1018 that the pet monitoring device 101 has been removed from the pet. This alert may be broadcast together with a location as a potential security alert that the pet's pet monitoring device 101 is being tampered with. This broadcast may include the pet's RFID microchip ID number.

The controller 1002 may control the RFID circuitry to stop attempting to perform an RFID read of the microchip 3 or any of the functions of the enclosure electronics to minimise battery drain The controller 1002 may control the RFID circuitry to immediately perform an RFID read of the microchip 3 and any other functions of the enclosure electronics when registering that the enclosure 2 has been re-connected to the collar 1.

Whilst in the above embodiments the antenna is included in a collar. The antenna may equally be included in a pet harness. In the harness the antenna may be around the neck of the pet, or further back around the tummy of the pet, behind the front legs of the pet. Alternatively, the antenna may be mounted on the top of the dog. The antenna may be detachable from the harness and may be attached to it in a number of different positions, for example by Velcro.

Any such alternative arrangement may benefit from the reader and antenna arrangement described here.

All these approaches may be used to ensure that the microchip 103 may be read reliably even it has migrated from its original position or been implanted in a non-standard position. Alternatively it may be used to reliably read a pet's microchip 103 where the pet shape leads to insufficient read range for the collar—an example of such a situation could include a pet with a long thin neck and a microchip 103 a long way from a relatively small area coil (which in turn reduces read range).

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A pet monitoring device for monitoring a sub-dermal RFID microchip, the pet monitoring device comprising:
   a wearable item bearing 1 to 5 turns of electrical conductor wound circumferentially to form a wearable item resonator; and
   an RFID reader attachable and detachable to said wearable item, wherein said RFID reader comprises:
      a driving circuit comprising a primary inductor which inductively couples to said wearable item in response to said RFID reader being attached to said wearable item;
      a secondary inductor and a resonance capacitor which conductively couple to said wearable item in response to said RFID reader being attached to said wearable item, wherein the secondary inductor and the resonance capacitor form the wearable item resonator with said electrical conductor, wherein the wearable item resonator comprises a circuit to automatically adjust a capacitance of said resonance capacitor to compensate for a size of said wearable item;
      wherein the driving circuit is operable to drive the wearable item resonator.

2. A pet monitoring device as claimed in claim 1, wherein the driving circuit comprises a resonance capacitor, the primary inductor and resonance capacitor of the driving capacitor forming a reader resonator.

3. A pet monitoring device as claimed in claim 2, wherein an inductance of said wearable item resonator is less than an inductance of said primary inductor of said reader resonator and where a quality factor (Q) of said wearable item resonator is higher than a quality factor (Q) of said reader resonator.

4. A pet monitoring device as claimed in claim 3, wherein the inductance of said wearable item resonator is based on an inductance of the electrical conductor and the secondary inductor.

5. A pet monitoring device as claimed claim 2, further comprising RFID reading circuitry configured to detect a resonance envelope in the wearable item resonator or the reader resonator and provide an RFID reading of the RFID microchip.

6. A pet monitoring device as claimed in claim 1, where the circuit to automatically adjust said resonance capacitor of the wearable item resonator comprises a plurality of capacitors each coupled to a respective switch to enable each of the plurality of capacitors to be switched in or out of parallel connection with said resonance capacitor of the wearable item resonator.

7. A pet monitoring device as claimed in claim 1, wherein the primary inductor is formed from a predetermined number of turns wound around a magnetic core and the secondary inductor is formed from a predetermined number of turns wound around said magnetic core.

8. A pet monitoring device as claimed in claim 1, wherein each of said RFID microchip and said RFID reader each include a respective temperature sensor.

9. A pet monitoring device as claimed in claim 1, wherein said wearable item includes an adjustment ring such that the wearable item is adjustable in fit without substantially changing a length of said electrical conductor.

10. A pet monitoring device as claimed in claim 1, wherein the wearable item bears a single turn of said electrical conductor.

11. A pet monitoring system comprising:
- a sub-dermal RFID microchip implanted in a pet; and
- a pet monitoring device for monitoring the sub-dermal RFID microchip, the pet monitoring device comprising:
  - a wearable item bearing 1 to 5 turns of electrical conductor wound circumferentially to form a wearable item resonator; and
  - an RFID reader attachable and detachable to said wearable item, wherein said RFID reader comprises:
    - a driving circuit comprising a primary inductor which inductively couples to said wearable item in response to said RFID reader being attached to said wearable item;
    - a secondary inductor and a resonance capacitor which conductively couple to said wearable item in response to said RFID reader being attached to said wearable item, wherein the secondary inductor and the resonance capacitor form the wearable item resonator with said electrical conductor, wherein the wearable item resonator comprises a circuit to automatically adjust a capacitance of said resonance capacitor to compensate for a size of said wearable item;
    - wherein the driving circuit is operable to drive the wearable item resonator.

12. A pet monitoring system as claimed in claim 11, wherein the RFID reader is configured to transmit a unique identifier to a remote device in the pet monitoring system, wherein the unique identifier comprises a unique ID number associated with the RFID microchip that is read by the RFID reader, and/or a unique ID number associated with the pet monitoring device.

13. A pet monitoring system as claimed in claim 12, wherein the sub-dermal RFID microchip comprises at least one sensor, the at least one sensor comprising one or any combination of: a temperature sensor, an activity sensor, a heart rate sensor, a pulse sensor, a respiration sensor, and a glucose level sensor; and the RFID reader is configured to transmit sensor data received from the at least one sensor of the RFID microchip in raw or processed form, to the remote device.

14. A pet monitoring system as claimed in claim 13, further comprising a server in a network, wherein the remote device is coupled to said network and is configured to upload the sensor data and the unique identifier to the server.

15. A pet monitoring system as claimed in claim 12, further comprising a server in a network the server coupled to a data store storing a plurality of microchip ID numbers of lost pets, each of the plurality of microchip ID numbers stored in association with an identifier of an owner of the respective lost pet, wherein the remote device is coupled to said network, wherein the remote device is configured to transmit a message comprising a location of the pet and the unique ID number associated with the RFID microchip to the server, the server configured to:
- compare the unique ID number associated with the RFID microchip to the plurality of microchip ID numbers stored in the data store;
- determine that the pet is lost based on said comparison; and
- transmit an alert to the owner of the pet indicating said location using the identifier associated with the unique ID number.

\* \* \* \* \*

UNITED STATES PATENT AND TRADEMARK OFFICE
CERTIFICATE OF CORRECTION

| | |
|---|---|
| PATENT NO. | : 11,464,205 B2 |
| APPLICATION NO. | : 16/608697 |
| DATED | : October 11, 2022 |
| INVENTOR(S) | : Nicholas Patrick Roland Hill |

It is certified that error appears in the above-identified patent and that said Letters Patent is hereby corrected as shown below:

In the Claims

Column 16, Line 62 In Claim 8, after "wherein" delete "each of".

Signed and Sealed this
Twenty-first Day of February, 2023

Katherine Kelly Vidal
*Director of the United States Patent and Trademark Office*